United States Patent
Wong et al.

(10) Patent No.: US 6,205,026 B1
(45) Date of Patent: Mar. 20, 2001

(54) HEAT SINK RETENTION COMPONENTS AND SYSTEM

(75) Inventors: Thomas J. Wong, Seattle; Neal Ulen, Lacey; Ketan R. Shah, Tumwater; Ishfaqur Raza, Olympia, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/494,807

(22) Filed: Jan. 31, 2000

(51) Int. Cl.[7] ................................... H05K 7/20
(52) U.S. Cl. ................ 361/704; 361/690; 361/694; 361/695; 174/16.3; 165/80.3; 257/718; 257/719; 257/727; 257/722; 411/516; 411/522; 411/523; 24/458; 24/520
(58) Field of Search ................... 361/702–704, 361/707, 709, 690, 694, 695, 697, 717–719, 722; 165/80.3, 185; 257/706, 707, 712, 713, 717–719, 722, 727; 174/16.3; 911/516, 522, 523; 248/316.7, 510; 24/457, 520, 458, 495

(56) References Cited

U.S. PATENT DOCUMENTS

| 4,679,118 | * | 7/1987 | Johnson et al. ............... 361/718 |
| 5,129,833 | * | 7/1992 | Rowlette, Sr. ................ 439/91 |
| 5,208,731 | * | 5/1993 | Blomquist .................... 361/704 |
| 5,232,372 | * | 8/1993 | Bradley et al. ............... 439/66 |
| 5,241,453 | * | 8/1993 | Bright et al. ................. 361/704 |
| 5,357,404 | * | 10/1994 | Bright et al. ................. 361/818 |
| 5,436,798 | * | 7/1995 | Wieland, Jr. ................. 361/710 |
| 6,071,128 | * | 6/2000 | Brewington et al. ........... 439/73 |
| 6,115,253 | * | 9/2000 | Clemens et al. ............... 361/704 |
| 6,118,657 | * | 9/2000 | Clemens ....................... 361/697 |

* cited by examiner

*Primary Examiner*—Gerald Tolin
*Assistant Examiner*—Boris L. Chervinsky
(74) *Attorney, Agent, or Firm*—Schwegman, Lundberg, Woessner & Kluth P.A.

(57) ABSTRACT

An integrated circuit system has an increased reliability when subjected to stress and vibration. The system includes heat sink retention clips that provide support to the retention system when an upward force is applied to a heat sink. An EMI shield can be provided that provides peripheral shielding for the circuit package thermally coupled to the heat sink.

15 Claims, 5 Drawing Sheets

HEAT SINK RETENTION COMPONENTS AND SYSTEM

TECHNICAL FIELD OF THE INVENTION

The present invention relates generally to heat sinks and in particular the present invention relates to circuit heat sink retention components and systems.

BACKGROUND

Historically, when microprocessors were first commercialized, each microprocessor held less than one million transistors, and operated at speeds below 20 MHZ. Typically, the microprocessors were either solder mounted to a motherboard directly or mounted to the motherboard through sockets. They were typically air cooled, and air flow was typically sustained by a system fan. Because of the relatively slow operating speeds electromagnetic interference (EMI) and electrostatic discharge (ESD) shielding was not a high priority.

The number of transistors contained in each microprocessor, as well as the processor operating speed, have increased dramatically. Correspondingly, the amount of heat that needs to be dissipated, and the amount of EMI emissions that need to be absorbed have increased. Sensitivity to ESD during operations has also increased. As a result, most of today's microprocessor based computer systems employ either local fans and/or heat sinks to help ensure that the microprocessors will run cool. At the same time, increased attention has been given to the design of a system chassis to ensure that adequate levels of EMI emission absorption and ESD resistance are met. The trend to increase transistor density and operating speed is expected to continue. It is expected that because of the amount of heat that needs to be dissipated, the precision of bonding between the processor package and a heat sink will reach a point of critical importance. That is, the physical bond between the processor package and the heat sink plays a critical role in heat dissipation.

EMI is produced in varying degrees by virtually every type of electrical equipment. Electromagnetic shielding is typically used to protect electrical equipment from unwanted electromagnetic radiation or EMI. Many systems such as processors require at least some shielding for proper operation or to meet EMI requirements for emissions and immunity. As circuit speeds and sensitivities increase so will the need for improved shielding. Shielding can be generally described as a conductive or ferromagnetic material which either reflects, absorbs or carries electromagnetic interference to ground. Electromagnetic shielding often provides protection for electrical equipment by reducing unwanted signals to levels that do not adversely affect equipment. This is achieved by both reflecting and absorbing the radiation signals. Reflection depends on a permeability and conductivity of the shielding material, and a frequency and wave impedance of the signal. Generally, the reflectance of a shielding material increases with frequency. The remaining signal passing through a shielding material is reduced by absorption. The resistivity and thickness of the shield, effects absorption. A magnetic material is more often effective in absorption.

To deal with low-frequency EMI, thick steel shields have been used to absorb the energy. However, absorption is more effective if the shield is protecting the electrical equipment from frequencies that are high.

Heat dissipation has been increased by using clips which physically hold a heat sink to the processor package. One such clip is a socket attach clip. To adequately dissipate heat from large integrated circuits, heat sinks require increased surface area. This results in an increased mass for the heat sink. Reliably retaining such large heat sinks during shock and vibration events is difficult.

For the reasons stated above, and for other reasons stated below which will become apparent to those skilled in the art upon reading and understanding the present specification, there is a need in the art for improved heat sink retention components and system. There is also a need for improved EMI shielding for circuitry.

DETAILED DESCRIPTION

Figure 1:
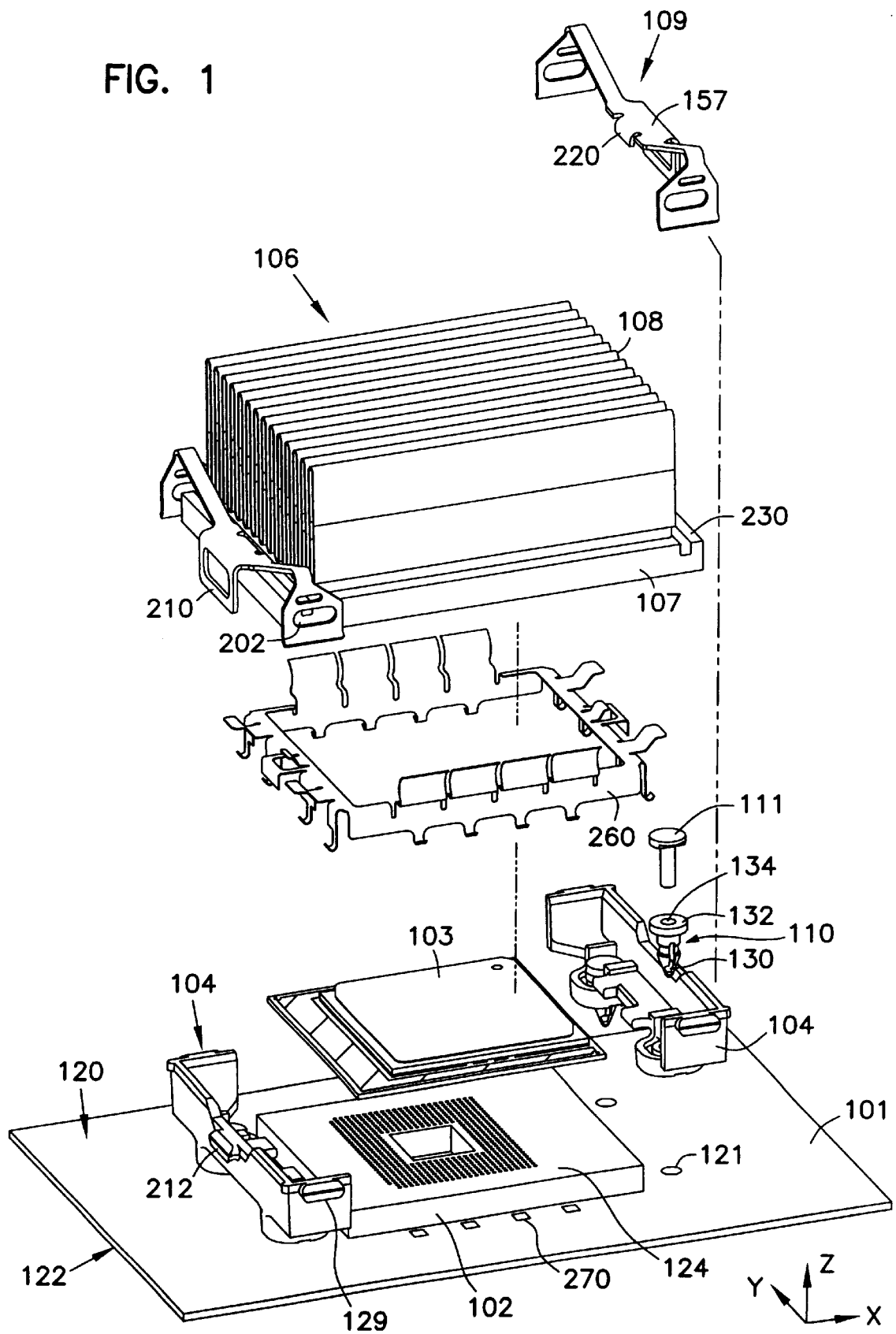
FIG. 1 illustrates one embodiment of a heat dissipation system and an electromagnetic interference (EMI) suppression device of the present invention.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

An integrated circuit retention system is described herein that has an increased reliability due to high stresses induced when subjected to mechanical shock and vibration. The system includes heat sink retention clips that provide support to the retention system. An EMI shield is also described that provides peripheral shielding for the circuit package.

FIG. 1 illustrates a heat dissipation system and an electromagnetic interference (EMI) suppression device that can be used to provide protection for an integrated circuit package. The EMI suppression device can be attached to a circuit board 101 having a top side 120 and a bottom side 122. The circuit board 101 can be any type of circuit board, but in one embodiment is a rigid board that contains mounting holes 121 for mounting retention, or retaining modules 104. A socket 102 is connected to topside 120 of the board 101. The retaining modules 104 can be connected to the board in a variety of known manners, such as soldering. Socket 102 has a number of female connections for providing electrical paths between male connectors, or pins (not shown) and circuit board 101. Thus, an integrated circuit package 103 having male connectors, or pins, is connected to a top portion 124 of the socket 102. While the present invention is not limited to male/female connectors, it is contemplated that one embodiment provides mounting of the integrated circuit package in a manner which allows for easy removal of the integrated circuit package.

In the embodiment of FIG. 1, two retaining modules 104 are affixed to circuit board 101 by the use of expandable fasteners 110. The fasteners 110 include a. first end 130 which is vertically split. The fasteners also have a second end 132 and an axially located hole 134. The fasteners 110 can be inserted through retention module 104 and mounting holes 121 of circuit board 101. The fasteners are engaged using plungers 111.

Plungers 111 include a shaft sized to fit into hole 134 of fasteners 110. By inserting plungers 111 into fasteners 110, the first end of fasteners 110 expand and physically grip circuit board 101. It will be appreciated that plungers 111 and fasteners 110 can be made of any resilient material, such as but not limited to nylon plastic.

Two retention modules 104 located on opposing sides of socket 102 are shown in the embodiment of FIG. 1. It will be appreciated by those skilled in the art after studying the present description that a single retention module could be used without departing from the invention. Further, more than two modules can be provided.

As explained above, the present invention provides EMI suppression for the integrated circuit package 103 by electrically grounding heat sink 106. The EMI shielding can provide protection from externally generated EMI and it can provide a suppression of EMI generated by the integrated circuit of the system. The heat sink is fabricated from a metallic material and is therefore electrically conductive. The size and conductive nature of the heat sink allow the heat sink to operate as an EMI shield. To perform as an EMI shield, the heat sink should be connected to a voltage potential to dissipate EMI. Preferably, the heat sink is connected to a ground potential. In prior EMI applications, the heat sink was connected to ground potential through an EMI wire, or strap. A heat sink grounded in this way provided some protection from received EMI, but does not provide adequate suppression of EMI radiation from the integrated circuit package. Some integrated circuitry, such as processors, can emit EMI in excess of allowed limits. Thus, a more complete shield is needed to suppress EMI emissions.

Figure 2:
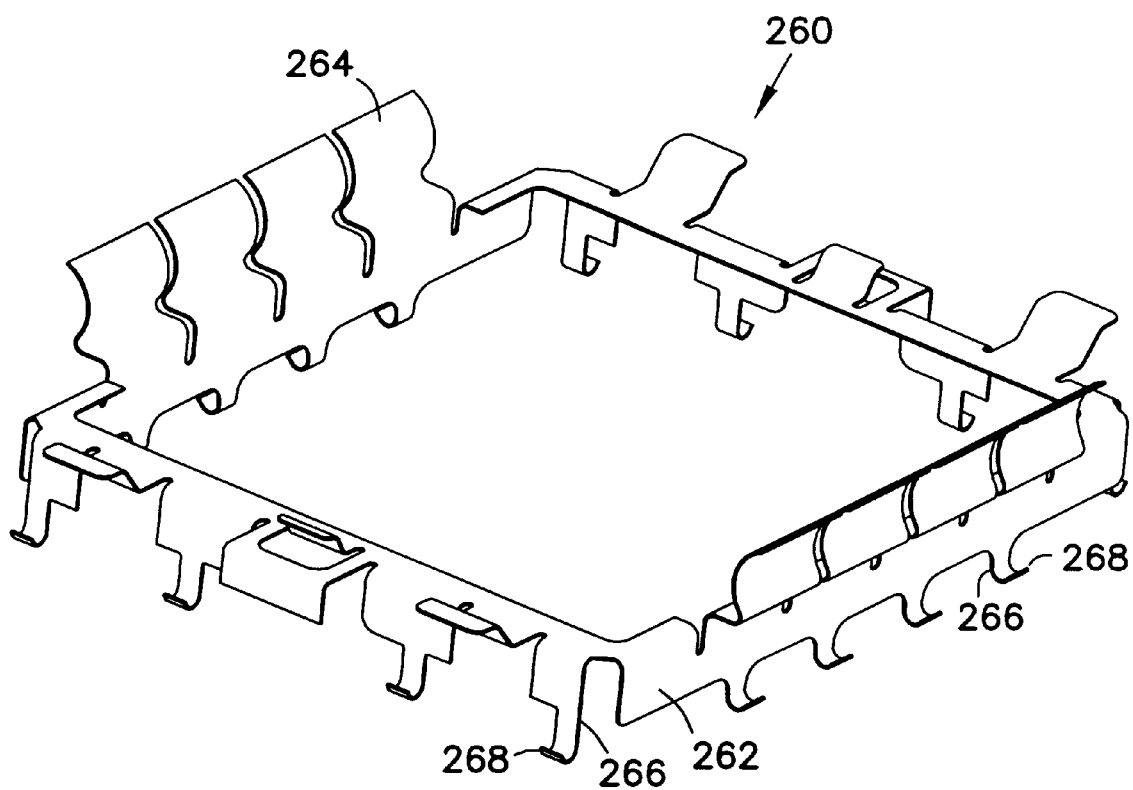
FIG. 2 is an EMI frame according to one embodiment of the present invention.

The present invention provides an EMI frame that surrounds the periphery of the integrated circuit package. Referring to FIG. 2, an EMI frame 260 according to one embodiment of the present invention is described. The frame includes a peripheral frame 262 that has numerous upwardly extending spring tabs 264 and numerous downwardly extending legs 266. Each leg 266 has a grounding foot 268. The grounding feet can extend in either an inward or outward direction. The peripheral frame is sized to fit around the integrated circuit package while closing portions of the vertical space between the bottom of heat sink 106 and circuit board 101. The amount of space between the heat sink and circuit board that needs to be closed will depend on the application. For example, a minimum leg width and spacing between legs can be defined upon quantifying the amount of EMI emissions generated by a particular circuit package.

When assembled, spring tabs 264 are compressed against the base of the heat sink. The number of spring tabs provided will depend upon the application. An increased number of tabs will provide more uniform grounding of the heat sink, but the increased tab count can also provide too much upward support to the heat sink and jeopardize the thermal contact between the heat sink and the circuit package. It will be understood that the spring tabs can extend in either an inward and/or an outward direction with respect to the integrated circuit package.

The grounding feet of the EMI frame physically contact ground pads 270 provided on the circuit board (FIG. 1). The ground pads are metal regions on the top surface of the circuit board that are electrically coupled to a bias voltage, such as ground. When assembled, the EMI frame rests on the circuit board ground pads and is held in place by the downward force exerted by the heat sink and retention clips. As such, the present embodiment does not require fasteners, thereby reducing assembly costs. Other embodiments can be provided where the EMI frame is attached to either the heat sink or the circuit board. The EMI ground frame can be made from any electrically conductive material, such as, but not limited to, brass, stainless steel or copper.

Referring again to FIG. 1, heat sink 106 is located on top of an integrated circuit package 103. It will be appreciated that the integrated circuit package 103 can contain any type of integrated circuit which produces heat, but the present invention is particularly suited for processors which operate at high speeds and produce relatively large amounts of heat. Heat sink designs vary, and the present invention is not limited to any specific design. In general, the heat sink 106 includes a base 107 and a heat dissipating region 108. The heat dissipation region 108 includes heat dissipation elements such as fins or rods which provide large surface areas for spreading heat. A fan is often used to provide air movement to increase the amount of heat dissipated over time. Heat sinks can be made of material with good heat dissipation characteristics, such as aluminum and copper. The size of heat sinks, and resultant weight, has resulted in need for supports to reduce the weight carried by the integrated circuit. Thus, the retention modules provide a physical support for the heat sink.

The base 107 of the heat sink 106 extends laterally from the heat-dissipating region and provides a platform securing the heat sink 106. Two retention clips 109 secure the heat sink 106 to the retention modules 104. The clips 109 include a central region 157 that contacts the heat sink base to secure the heat sink in a downward manner to circuit package 103. In one embodiment, the clips 109 provide a downward force on the heat sink base 107 to hold the heat sink 106 in the retention modules 104. The retention modules support, or partially support, heat sink 106. That is, heat sink 106 needs to maintain thermal contact with integrated circuit package 103 but should not fully rest upon the package. Retention modules 104, therefore, include support ledges to provide vertical support for the heat sink. The retention modules 104 also provide lateral support for the heat sink 106.

As stated above, the size and weight of a heat sink can be significant. In some applications, the heat sink can weigh in excess of 450 grams. As such, both shock and vibration can adversely effect the retention system. Further, if the system where rotated such that the heat sink was below the circuit package, the retention clips could be damaged. For example, if the heat sink system of FIG. 1 where rotated 180 degrees so that heat sink 106 was below circuit package 103, the force exerted on region 157 of the clips could bend the clips. This would result in a loss of the spring characteristics of the clips.

Figure 3:
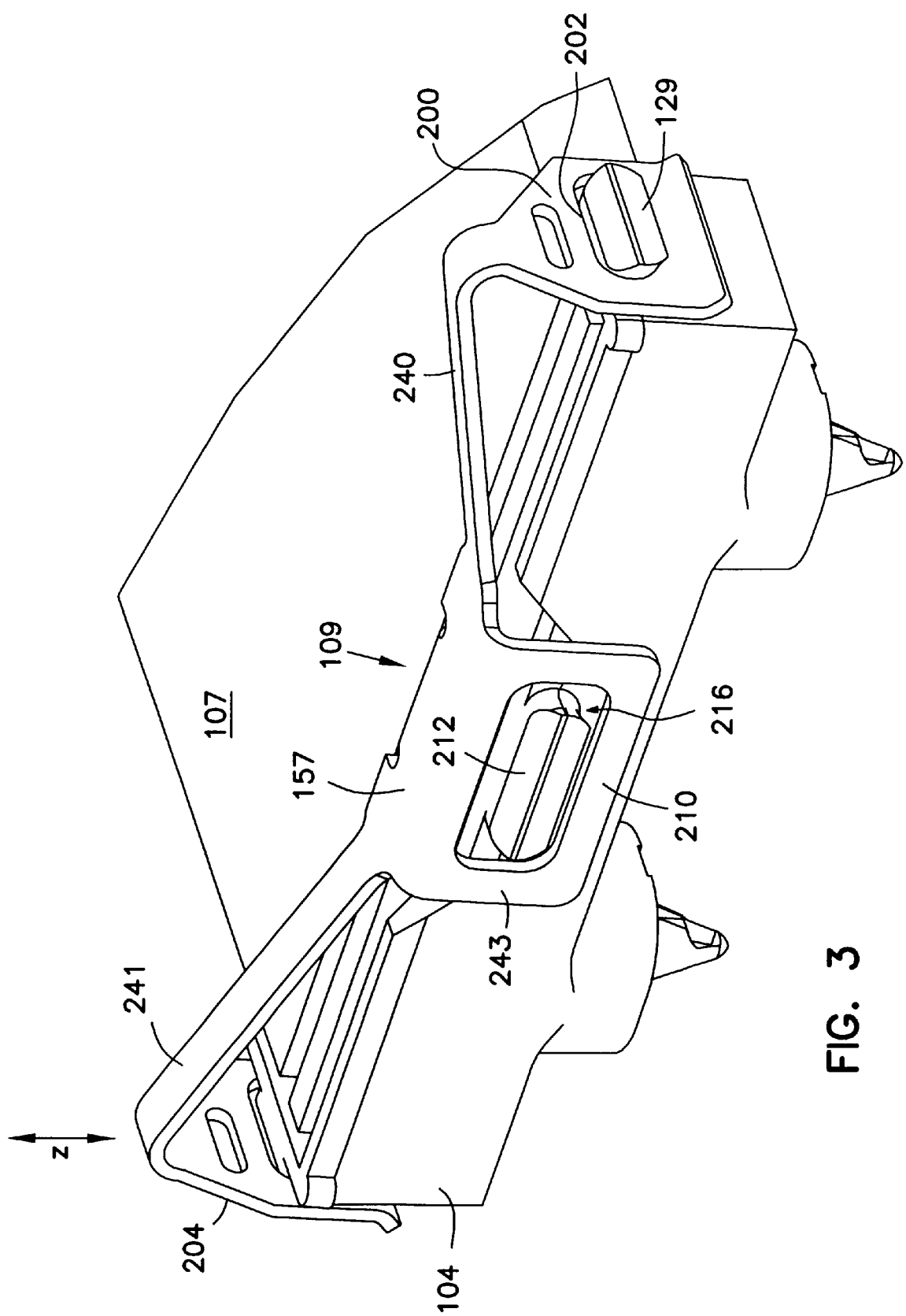
FIG. 3 provides a more detailed illustration of an embodiment of a retention clip of the present invention.

FIG. 3 provides a more detailed illustration of an embodiment of a retention clip 109 of the present invention. The clip has a first end region 200 that includes a retention window 202 that engages fastener tab 129 of retention module 104. Note that the bottom of window 202 is in contact with the fastener tab. This provides a downward force in region 157 on base 107 of the heat sink. That is, the bends in clip 109 provide a spring action that is activated by the engagement with fastener tabs 129. The retention clip has a second end region 204 that also includes a retention window for engaging a similar fastener tab. It will be appreciated by those skilled in the art, with the benefit of the present description, that the window/tab configuration can be reversed. That is, the retention clip can comprise tabs and the retaining modules can comprise openings to receive the tabs. Further, other types of fastening methods can be used to secure the retention clips to the retention modules while maintaining a downward force on the heat sink.

The retention clip also includes a stop window 210 in the center region 157 of the retention clip. The stop window engages retention tab 212. Note, however, that there remains a gap 216 between a bottom of the retention tab and a bottom of window 210. The stop window, therefore, does not provide a spring force to the clip during normal retention operation. However, the stop window provides a safety catch in the Z-direction if the heat sink system is rotated about a horizontal plane. That is, the bottom of tab 212 and the bottom of window 210 will come in contact if heat sink 107 is pulled away from retention modules 104 (upward force on heat sink). It will be appreciated by those skilled in the art, with the benefit of the present description, that the safety catch (stop window/retention tab) configuration can be reversed. That is, the retention clip can comprise a stop tab and the retaining modules can comprise openings to receive the stop tabs. The safety catch is used to prevent damage to the retention clip when an upward force is applied to the heat sink, but is not engaged during typical operation.

In sum, each heat sink retention clip comprises a central region 157, and first 240 and second 241 arm members extending laterally and upwardly in opposite directions from the central region. A first fastener end 200 downwardly extends from an outward end of the first arm member. The first fastener end comprises a first retention window 202 to mechanically couple to a first retention tab 129 provided on a first side of the heat sink retention module 104. A second fastener end 204 downwardly extends from an outward end of the second arm member. The second fastener end comprises a second retention window to mechanically couple to a second retention tab provided on a second side of the heat sink retention module. The shape of the heat sink retention clip in combination with the two windows provides a clamping force on the heat sink to keep the heat sink in contact with the heat sink retention module. A stop plate 243 downwardly extends from the central region of the clip and has a stop window 210 to mechanically engage a third retention tab 212 when an upward stress is applied to the heat sink.

Figure 4:
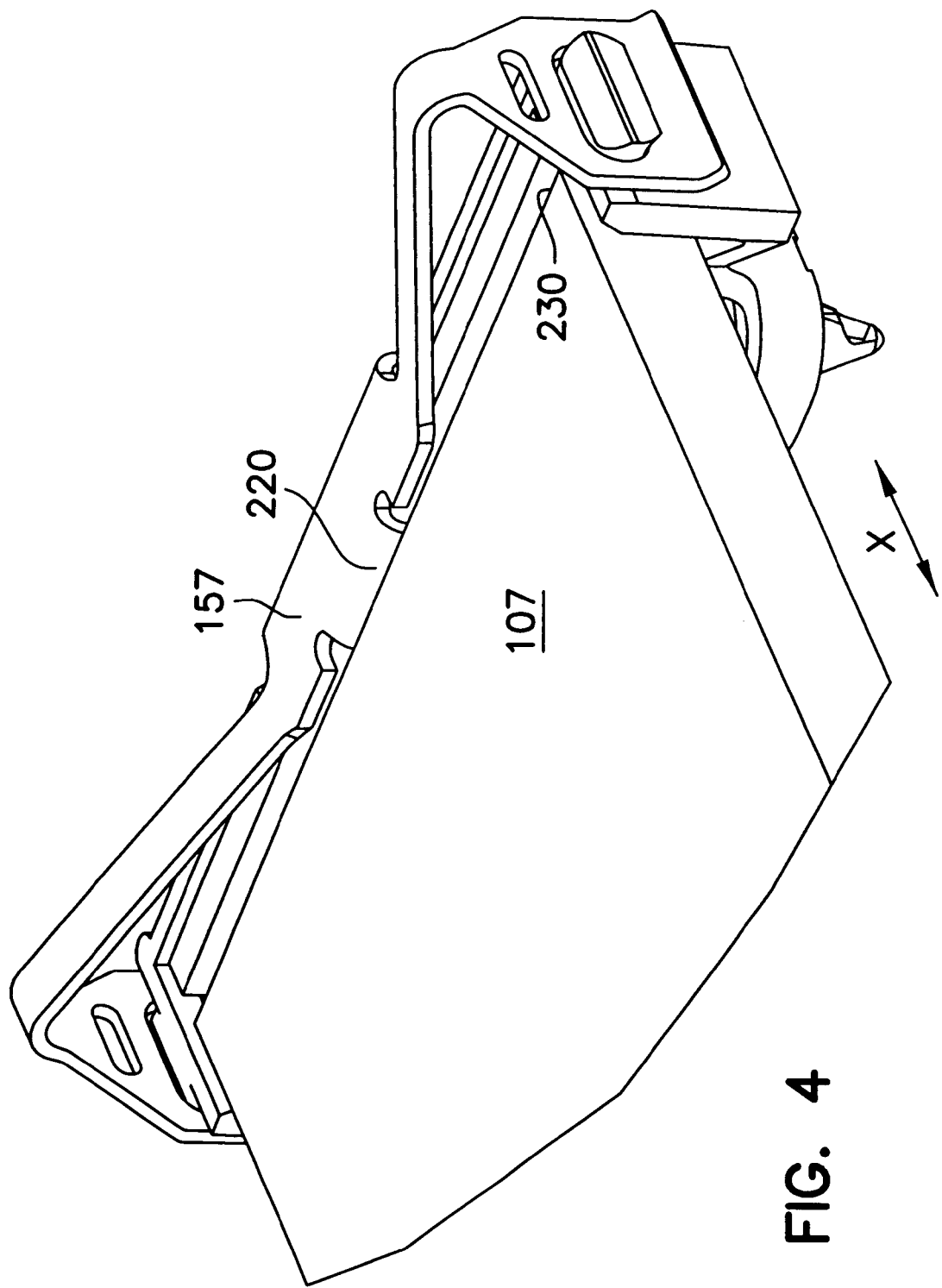
FIG. 4 provides another view of the retention clip of FIG. 3.

Retention modules 104 provide some support in the X and Y directions. Referring to FIG. 4, additional support in the X and Y directions can be supplemented by using a pedestal tab 220 that fits in a groove 230 provided on a top surface of heat sink base 107. It will be appreciated that the groove does not have to extend laterally across the heat sink base, but can be sized to accept the pedestal tab. Tab 220 provides a clamping force to the heat sink, so during movement in the X, Y, and Y directions the pedestal tab restricts the retention clip 109 from flaring outward and allowing the heat sink to disengage from the retention modules.

Figure 5:
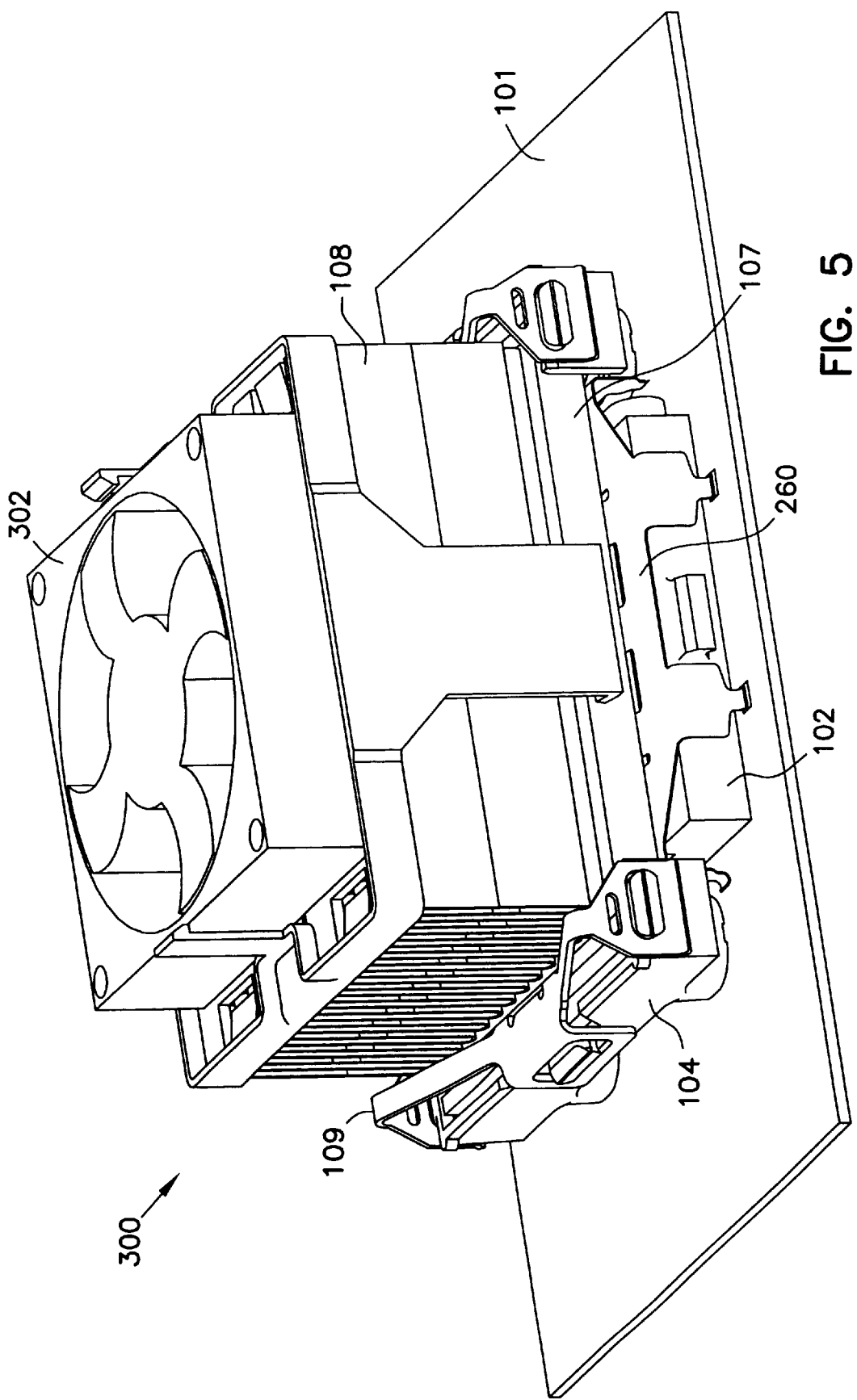
FIG. 5 illustrates one embodiment of an assembled circuit system according to one embodiment of the present invention.

FIG. 5 illustrates one embodiment 300 of an assembled circuit system. The system includes a heat sink 106 having a plurality of heat dissipating elements, such as fins. The heat transfer characteristics of the system are improved through the use of a fan 302 to circulate air through the elements. The heat sink includes a base 107 that is in thermal contact with the circuit package. In this embodiment, the package has numerous conductive pins extending from the bottom of the package. The circuit package mounts in a pin socket 102. The pin socket can be a zero insertion force (ZIF) socket that receives the pins from the circuit package. The socket can include an activation mechanism to lock the pins in place and make electrical interconnects between the circuit package and a circuit board, also referred to as a motherboard. The heat sink is vertically supported in-part by the socket and circuit package. To reduce the load carried by the circuit package and socket, retention modules 104 are also used to support the heat sink. Retention clips 109 secure the heat sink to the retention modules and provide a downward force on the heat sink to maintain appropriate thermal contact with the circuit package. The retention clips include a stop window and a pedestal tab to increase the retention reliability when the system is subjected to forces in the X, Y, and Z directions. Finally, an EMI frame 260 is located between the heat sink and the circuit board. The EMI frame grounds the heat sink and provides additional shielding around the periphery of the circuit package.

CONCLUSION

An integrated circuit system has been described that has an increased reliability due to high stresses induced when subjected to mechanical shock and vibration. The system includes heat sink retention clips that provide support to the retention system. An EMI shield has also been described that provides peripheral shielding for the circuit package.

It will be appreciated with the benefit of the present description that the mechanical changes can be made without departing from the present invention. These changes area often driven be assembly requirements and economic constraints. The present invention however provides a retention system for a heat sink. The system also provides an electrical coupling between the heat sink and a voltage (ground) to provide electrical shielding.

What is claimed is:

1. A heat sink system comprising:
    a heat sink;
    a heat sink retention module located below the heat sink to provide vertical support for the heat sink; and
    a heat sink retention clip located above the heat sink and having a first end, a second opposite end and a central region, the heat sink retention clip comprising a first retention window located at the first end and a second retention window located at the second end, the first and second retention windows mechanically couple to first and second retention tabs provided on the heat sink retention module, the heat sink retention clip provides a clamping force on the heat sink to keep the heat sink in contact with the heat sink retention module, the heat sink retention clip further comprises a stop window located in the central region to mechanically engage a third retention tab when an upward force is applied to the heat sink.

2. The heat sink system of claim 1 wherein the heat sink comprises a heat sink base and heat dissipating elements coupled to the heat sink base.

3. The heat sink system of claim 2 wherein the heat sink retention clip engages the heat sink base.

4. The heat sink system of claim 3 wherein the heat sink retention clip further comprises a downwardly extending pedestal tab to fit in a groove provided on a top surface of the heat sink base.

5. The heat sink system of claim 1 wherein the heat sink retention module is connected to a circuit board and the heat sink system further comprises:
    an electromagnetic interference frame located between the heat sink and the circuit board, the electromagnetic interference frame surrounds a periphery of a circuit package thermally coupled to a bottom of the heat sink, the electromagnetic interference frame further electrically couples the heat sink to the circuit board.

6. A heat sink system comprising:

an integrated circuit package having a top surface;

a heat sink thermally coupled to the top surface of the integrated circuit package;

a circuit board located below and electrically coupled to the integrated circuit package;

an electromagnetic interference frame located between the heat sink and the circuit board, the electromagnetic interference frame surrounds a periphery of the integrated circuit package, the electromagnetic interference frame further electrically couples the heat sink to the circuit board;

a heat sink retention module coupled to the circuit board and located below the heat sink to provide vertical support for the heat sink; and a heat sink retention clip located above the heat sink and having a first end, a second opposite end and a central region, the heat sink retention clip comprising a first retention window located at the first end and a second retention window located at the second end, the first and second retention windows mechanically couple to first and second retention tabs provided on the heat sink retention module, the heat sink retention clip provides a clamping force on the heat sink to keep the heat sink in contact with the heat sink retention module, the heat sink retention clip further comprises a stop window located in the central region to mechanically engage a third retention tab when an upward force is applied to the heat sink.

7. The heat sink system of claim 6 wherein the heat sink retention clip further comprises a downwardly extending pedestal tab to fit in a groove provided on a top surface of a heat sink base of the heat sink.

8. A heat sink system comprising:

a heat sink;

a heat sink retention module located below the heat sink to provide vertical support for the heat sink; and a heat sink retention clip comprising, a central region, first and second arm members extending laterally and upwardly in opposite directions from the central region, a first fastener end downwardly extending from an outward end of the first arm member, the first fastener end comprises a first retention window to mechanically couple to a first retention tab provided on a first side of the heat sink retention module, a second fastener end downwardly extending from an outward end of the second arm member, the second fastener end comprises a second retention window to mechanically couple to a second retention tab provided on a second side of the heat sink retention module, the heat sink retention clip provides a clamping force on the heat sink to keep the heat sink in contact with the heat sink retention module, and a stop plate downwardly extending from the central region and having a stop window to mechanically engage a third retention tab when an upward force is applied to the heat sink.

9. The heat sink system of claim 8 wherein the heat sink retention clip further comprises a downwardly extending pedestal tab that fits into an opening provided on a top surface of a heat sink base of the heat sink.

10. The heat sink system of claim 8 wherein the heat sink retention module is connected to a circuit board and the heat sink system further comprises:

an electromagnetic interference frame located between the heat sink and the circuit board, the electromagnetic interference frame surrounds a periphery of a circuit package thermally coupled to a bottom of the heat sink, the electromagnetic interference frame further electrically couples the heat sink to the circuit board.

11. The heat sink system of claim 10 wherein the circuit package comprises a processor circuit.

12. A heat sink system comprising:

an integrated circuit package having a top surface;

a heat sink thermally coupled to the top surface of the integrated circuit package, the heat sink comprises a heat sink base and heat dissipating elements coupled to the heat sink base;

a cooling fan coupled to the heat dissipating elements;

a circuit board located below and electrically coupled to the integrated circuit package;

a plurality of heat sink retention modules coupled to the circuit board and located below the heat sink to provide vertical support for the heat sink;

at least two retention clips coupled to the plurality of heat sink retention modules, the at least two retention clips are connected to the plurality of heat sink retention modules in at least two locations so that the at least two retention clips provide a downward force on the heat sink, the at least two retention clips further comprise a safety catch to prevent damage to the retention clip when an upward force is applied to the heat sink; and an electromagnetic interference frame located between the heat sink and the circuit board, the electromagnetic interference frame surrounds a periphery of the integrated circuit package, the electromagnetic interference frame further electrically couples the heat sink to the circuit board.

13. The heat sink system of claim 12 further comprising an interconnect socket located between the circuit board and the integrated circuit package.

14. The heat sink system of claim 12 wherein the integrated circuit package comprises a processor circuit.

15. The heat sink system of claim 12 wherein the heat sink retention clip further comprises a downwardly extending pedestal tab that fits into an opening provided on a top surface of the heat sink base.

* * * * *